US011631776B2

(12) United States Patent
Fukaya et al.

(10) Patent No.: US 11,631,776 B2
(45) Date of Patent: Apr. 18, 2023

(54) PHOTOELECTRIC CONVERSION ELEMENT

(71) Applicant: CANON KABUSHIKI KAISHA, Tokyo (JP)

(72) Inventors: Youichi Fukaya, Tokyo (JP); Takayuki Sumida, Kawasaki (JP); Akira Shimazu, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 162 days.

(21) Appl. No.: 17/061,763

(22) Filed: Oct. 2, 2020

(65) Prior Publication Data

US 2021/0111291 A1 Apr. 15, 2021

(30) Foreign Application Priority Data

Oct. 11, 2019 (JP) .............................. JP2019-187555

(51) Int. Cl.
| | |
|---|---|
| *H01L 31/0352* | (2006.01) |
| *H01G 9/20* | (2006.01) |
| *H01L 31/032* | (2006.01) |
| *H01L 31/07* | (2012.01) |
| *C01G 21/21* | (2006.01) |
| *C09K 11/66* | (2006.01) |
| *B82Y 20/00* | (2011.01) |
| *B82Y 40/00* | (2011.01) |

(52) U.S. Cl.
CPC ...... *H01L 31/035218* (2013.01); *C01G 21/21* (2013.01); *C09K 11/66* (2013.01); *H01G 9/2027* (2013.01); *H01L 31/0324* (2013.01); *H01L 31/07* (2013.01); *B82Y 20/00* (2013.01); *B82Y 40/00* (2013.01); *C01P 2004/64* (2013.01); *C01P 2006/60* (2013.01)

(58) Field of Classification Search
CPC ....... H01L 31/035218; H01L 27/14665; H01L 27/14667; C09K 11/56
See application file for complete search history.

(56) References Cited

U.S. PATENT DOCUMENTS

| | | | |
|---|---|---|---|
| 7,118,627 B2 * | 10/2006 | Hines ..................... | B82Y 30/00 117/68 |
| 8,476,616 B2 | 7/2013 | Sargent et al. | |
| 9,274,372 B2 * | 3/2016 | Park ................... | G02F 1/133615 |
| 2005/0236556 A1 * | 10/2005 | Sargent ................ | C09K 11/565 250/214.1 |
| 2008/0156371 A1 * | 7/2008 | LoCascio ............... | H05B 33/14 136/258 |

(Continued)

FOREIGN PATENT DOCUMENTS

KR 20120133700 A * 12/2012

*Primary Examiner* — Jarrett J Stark

(74) *Attorney, Agent, or Firm* — Venable LLP

(57) ABSTRACT

The present disclosure is a photoelectric conversion element including: a photoelectric conversion layer 5 including a first quantum dot 4a and a second quantum dot 4b, a ratio X of the number of heavy metal atoms to the number of oxygen group atoms is less than 2 on a surface of the nanoparticle of the first quantum dot 4a, the ratio X is greater than or equal to 2 on a surface of the nanoparticle of the second quantum dot 4b, and Equation (1) is satisfied:

$$0.3 < N \quad (1),$$

where N denotes a ratio of the number of second quantum dots to the number of first quantum dots.

12 Claims, 5 Drawing Sheets

(56) References Cited

U.S. PATENT DOCUMENTS

| | | | |
|---|---|---|---|
| 2010/0044676 A1* | 2/2010 | Sargent | H01L 51/4213 257/21 |
| 2011/0073835 A1* | 3/2011 | Ren | C01B 19/007 977/773 |
| 2012/0132891 A1* | 5/2012 | Pease, III | H01L 21/02521 257/15 |
| 2013/0092221 A1* | 4/2013 | De Moura Dias Mendes | H01L 31/03923 136/255 |
| 2013/0263918 A1* | 10/2013 | Konstantatos | H01L 31/03925 257/14 |
| 2015/0129838 A1* | 5/2015 | Lewis | H01L 31/035236 438/94 |
| 2016/0172513 A1* | 6/2016 | Williams | H01L 27/14601 977/774 |
| 2016/0200974 A1* | 7/2016 | Smith | C30B 7/005 117/64 |
| 2016/0211392 A1* | 7/2016 | So | H01L 31/101 |
| 2016/0336477 A1* | 11/2016 | Hwang | H01L 31/035218 |
| 2016/0380136 A1* | 12/2016 | Ning | H01L 31/0296 252/519.4 |
| 2017/0018669 A1* | 1/2017 | Williams | H01L 31/1876 |
| 2017/0213924 A1* | 7/2017 | Kubo | C01B 19/007 |
| 2020/0033690 A1* | 1/2020 | Ren | G02F 1/172 |
| 2020/0318255 A1* | 10/2020 | Lhuillier | C30B 29/46 |
| 2021/0111291 A1* | 4/2021 | Fukaya | H01L 31/07 |
| 2021/0391373 A1* | 12/2021 | Okamoto | H01L 27/14625 |
| 2022/0037544 A1* | 2/2022 | Sun | H01L 31/075 |
| 2022/0081613 A1* | 3/2022 | Jeong | C01G 15/00 |
| 2022/0115610 A1* | 4/2022 | Takata | H01L 51/426 |
| 2022/0115611 A1* | 4/2022 | Takata | H01L 27/144 |

\* cited by examiner

PHOTOELECTRIC CONVERSION ELEMENT

BACKGROUND OF THE INVENTION

Field of the Invention

The present disclosure relates to a photoelectric conversion element.

Description of the Related Art

Conventionally, photodiodes using an impurity diffusion layer formed in a monocrystal silicon substrate have been widely used as a photoelectric conversion unit of a photo-detection device forming a solid state image pickup device. In recent years, a photodetection device having high light-usage efficiency made of a photoelectric conversion layer using an organic material or nanoparticles called quantum dots having high optical sensitivity in a long wavelength range in which silicon has low sensitivity has been proposed. Furthermore, in a photodetection device using quantum dots, it is possible to set any light absorption wavelength to be detected by controlling the quantum dot size.

A quantum dot is formed of a nanoparticle and ligands coupled on the nanoparticle surface. As a nanoparticle material, compound semiconductors made of a heavy metal element such as Pb, Cd, or the like and an oxygen group element such as S, Se, Te, or the like have been widely used. Further, a photoelectric conversion layer is typically formed by applying a dispersion liquid of quantum dots to a substrate.

In a state of a quantum dot dispersion liquid, ligands are required to work to ensure dispersion stability of quantum dots. Thus, a fatty acid such as oleic acid having a long molecular chain length is typically used for ligands so as to prevent nanoparticles from coming close to each other.

On the other hand, if the molecular chain length of a ligand of a quantum dot in a film remains long in a state of a quantum dot film, the distance between nanoparticles increases, and carrier conductivity becomes extremely low. To solve this, as disclosed in the specification of U.S. Pat. No. 8,476,616, ligand exchange is performed to exchange ligands of quantum dots in a film to molecules having a short molecular chain length.

Typically, such ligand exchange is performed by immersing a quantum dot film coordinated with ligands having a long molecular chain length into a ligand solution in which ligands having a relatively shorter molecular chain length are dissolved in methanol or the like. The ligands of quantum dots in a film immersed in the ligand solution are substituted with molecules having a short molecular chain length. After a residual component is sublimated in a subsequent heating process, a photoelectric conversion layer having high carrier conductivity and a superior photoelectric conversion property is obtained.

As result of study by the present inventors, condensation was found in some of nanoparticles during a ligand exchange operation disclosed in the specification of U.S. Pat. No. 8,476,616. It was found that the condensed nanoparticles were fused in the subsequent thermal process and thus resulted in a reduction in the bandgap and an increase in dark current as in a photoelectric conversion element. Moreover, it was found that the peak wavelength of optical sensitivity was shifted from a desired wavelength range. These caused a reduction in the SN ratio (a value obtained by dividing a sensor output value in a light irradiation state by a sensor output value in a dark state) in a desired wavelength region that is an index of a sensor.

SUMMARY OF THE INVENTION

The present disclosure has been made in view of the above problems and intends to reduce condensation of nanoparticles and reduce dark current in a photoelectric conversion element.

A first photoelectric conversion element of the present disclosure includes: a photoelectric conversion layer including a first quantum dot and a second quantum dot, the first quantum dot and the second quantum dot each have a nanoparticle including a heavy metal atom and an oxygen group atom, a ratio X of the number of heavy metal atoms to the number of oxygen group atoms is less than 2 on a surface of the nanoparticle of the first quantum dot, the ratio X is greater than or equal to 2 on a surface of the nanoparticle of the second quantum dot, and Equation (1) is satisfied:

$$0.3 < N \tag{1}$$

where N denotes a ratio of the number of second quantum dots to the number of first quantum dots.

Further, a second photoelectric conversion element of the present disclosure includes: a photoelectric conversion layer including a first quantum dot and a second quantum dot, the first quantum dot and the second quantum dot each have a nanoparticle including a heavy metal atom and an oxygen group atom, a ratio X of the number of heavy metal atoms to the number of oxygen group atoms is less than 2 on a surface of the nanoparticle of the first quantum dot, the ratio X is greater than or equal to 2 on a surface of the nanoparticle of the second quantum dot, and Equation (2) is satisfied:

$$(2d_L/3d_S)^2 \leq N \tag{2}$$

where $d_L$ denotes an average particle diameter of nanoparticles of the first quantum dots, $d_S$ denotes an average particle diameter of nanoparticles of the second quantum dots, and N denotes a ratio of the number of second quantum dots to the number of first quantum dots.

Further features of the present invention will become apparent from the following description of exemplary embodiments with reference to the attached drawings.

DESCRIPTION OF THE EMBODIMENTS

Figure 1:
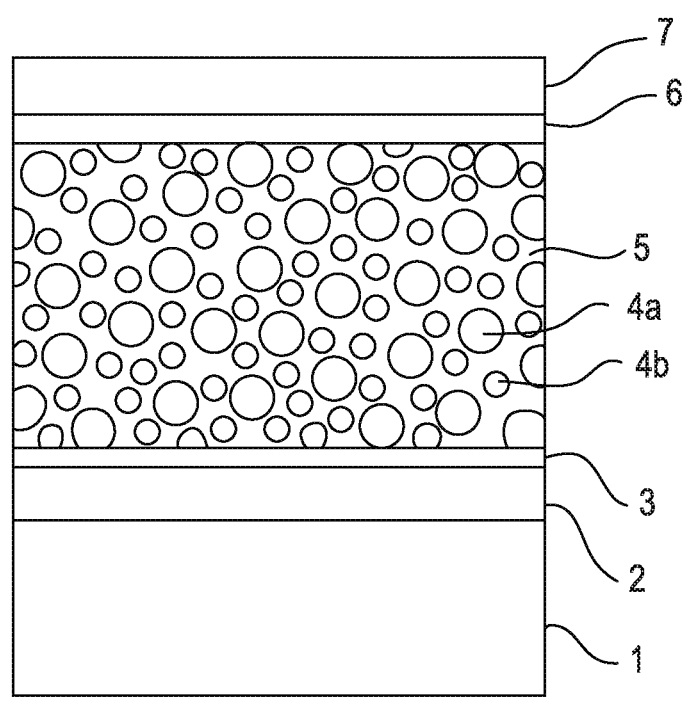
FIG. 1 is a schematic sectional view illustrating a photoelectric conversion element according to an embodiment of the present disclosure.

FIG. 1 is an example of a schematic sectional view of a photoelectric conversion element according to the present embodiment. On a substrate 1, a first electrode layer 2, a first interface layer 3, a photoelectric conversion layer 5, a second interface layer 6, and a second electrode layer 7 are provided. The first electrode layer 2 and the second electrode layer 7 may be correctively referred to as a pair of electrodes. Further, the first electrode layer 2 and the second electrode layer 7 may be a lower electrode layer and an upper electrode layer, respectively.

The photoelectric conversion element according to the present embodiment is an element having the first electrode layer 2, the second electrode layer 7, and the photoelectric conversion layer 5 arranged between the first electrode layer 2 and the second electrode layer 7. The photoelectric conversion layer 5 is a layer that converts received light into charges. The converted charges are polarized and collected by either one of the pair of electrodes 2 and 7. The photoelectric conversion layer 5 may be configured to be applied with an electric field from the first electrode layer 2 and the second electrode layer 7. The pair of electrodes 2 and 7 are an electrode that collects holes and an electrode that collects electrons. The electrode that collects holes may be referred to as a positive electrode or a cathode. The electrode that collects electrons may be referred to as a negative electrode or an anode. At least one of the pair of electrodes 2 and 7 may be transparent.

The photoelectric conversion element may have the interface layers 3 and 6 between the photoelectric conversion layer 5 and at least one of the pair of electrodes 2 and 7. Each of the interface layers 3 and 6 may be an electron block layer that is a layer to reduce transfer of electrons from the photoelectric conversion layer 5 to the cathode or a hole block layer that is a layer to reduce transfer of holes from the photoelectric conversion layer 5 to the anode.

1. Photoelectric Conversion Layer 5

The photoelectric conversion layer 5 of an embodiment of the present disclosure includes first quantum dots 4a and second quantum dots 4b. The first quantum dot 4a and the second quantum dot 4b have nanoparticles including heavy metal atoms and oxygen group atoms.

In the surface of a first nanoparticle of the first quantum dot 4a, a ratio X of the number of heavy metal atoms to the number of oxygen group atoms (the number of heavy metal atoms/the number of oxygen group atoms) is less than 2. The infrared range absorption wavelength of the photoelectric conversion layer 5 is defined by the size of the first quantum dot 4a. Further, in the surface of a second nanoparticle of the second quantum dot 4b, the ratio X of the number of heavy metal atoms to the number of oxygen group atoms (the number of heavy metal atoms/the number of oxygen group atoms) is greater than or equal to 2. The dispersion property of respective quantum dots is ensured by the mixture amount of the second quantum dots 4b.

1.1 Quantum Dots 4a, 4b

Figure 2:
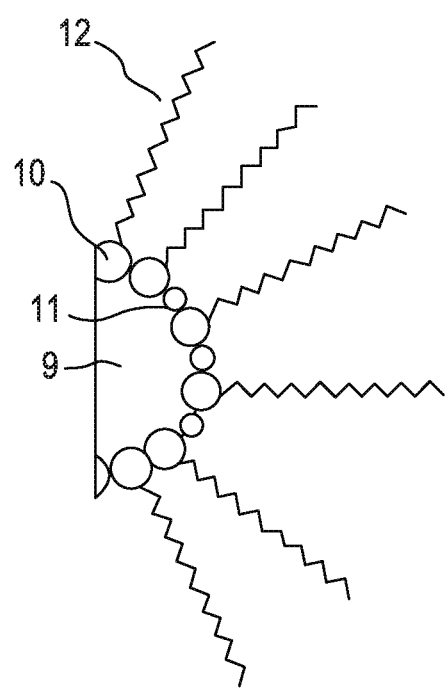
FIG. 2 is a schematic partial view illustrating a quantum dot according to the embodiment of the present disclosure.
Figure 3:
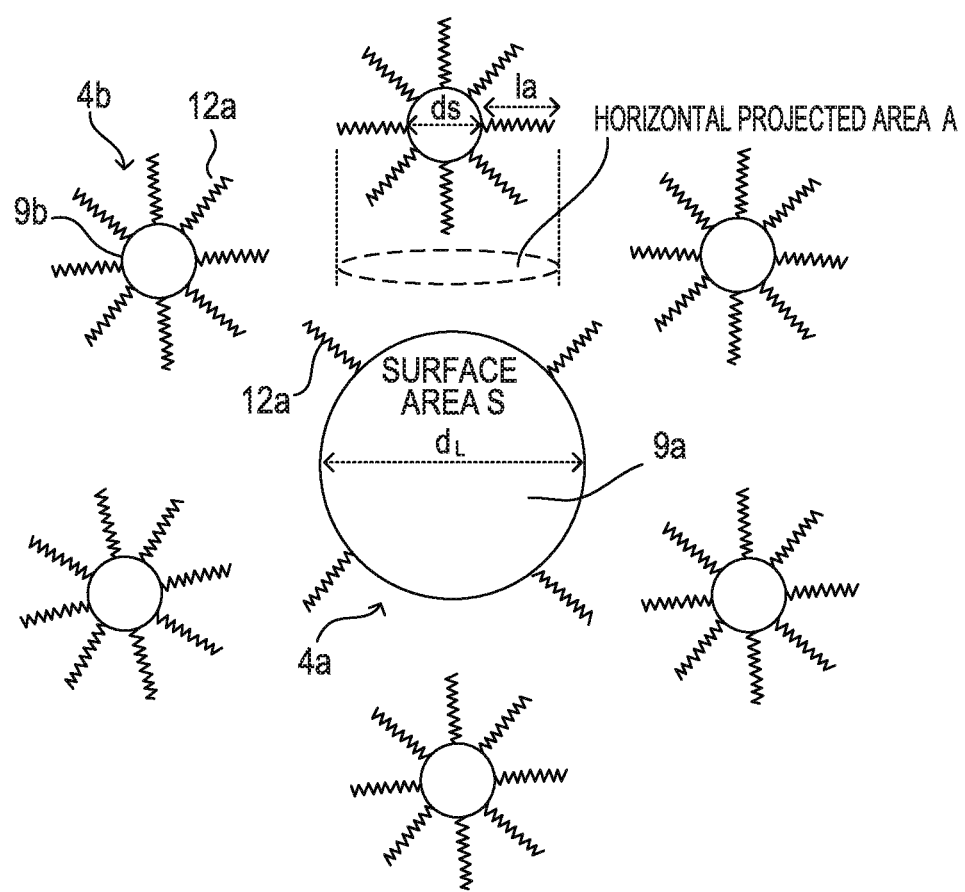
FIG. 3 is a schematic diagram illustrating a quantum dot to which first ligands are coordinated according to the embodiment of the present disclosure.
Figure 4:
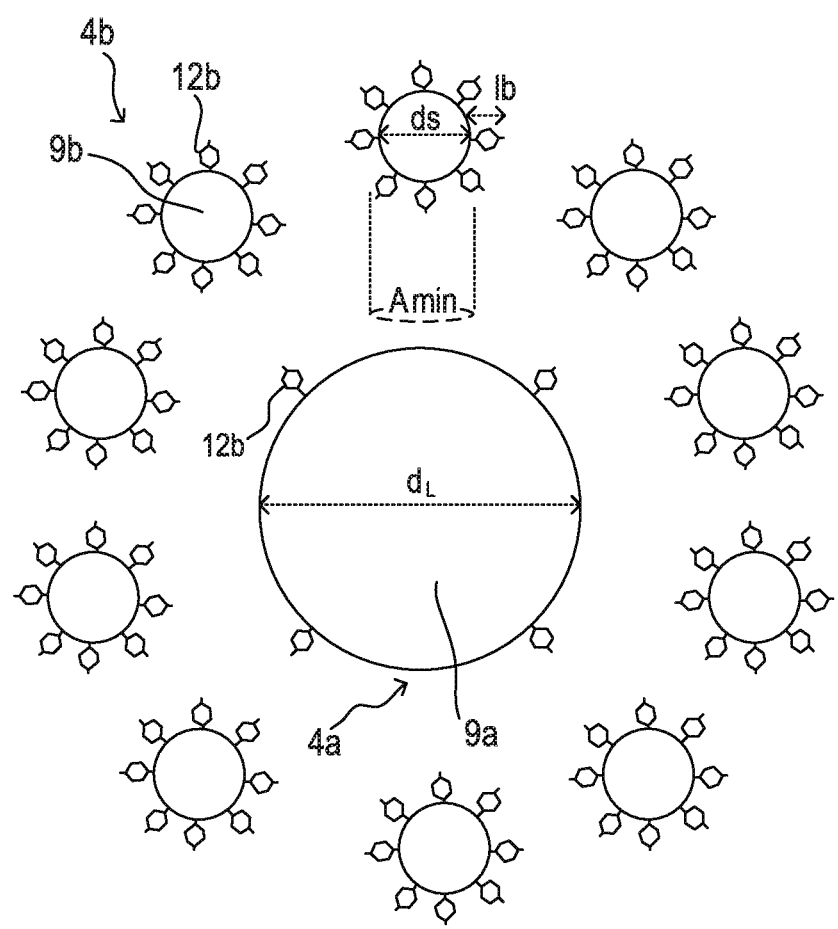
FIG. 4 is a schematic diagram illustrating a quantum dot to which second ligands are coordinated according to the embodiment of the present disclosure.

FIG. 2 is a schematic partial view of a quantum dot according to the embodiment of the present disclosure. Further, FIG. 3 is a schematic diagram illustrating a quantum dot to which first ligands are coordinated. FIG. 4 is a schematic diagram illustrating a quantum dot to which second ligands are coordinated. As illustrated in FIG. 2, ligands 12 are coordinated to a nanoparticle 9 to form a quantum dot.

1.1.1 Nanoparticle 9

The nanoparticle 9 includes heavy metal atoms 10 and oxygen group atoms 11. The heavy metal atom 10 may be a metal whose specific gravity is greater than or equal to 4 and may be, for example, Pb, Cd, or the like, and the oxygen group atom 11, that is, a group 16 atom may be, for example, O, S, Se, Te, or the like. Specifically, a material of the nanoparticle 9 may be a semiconductor material having a relatively narrow bandgap made of a compound of a heavy metal atom and an oxygen group atom such as PbS, PbSe, PbTe, CdS, CdSe, CdTe, or the like, for example. It is preferable that the nanoparticle material be PbS or PbSe among the above in terms of easiness of synthesis or optical sensitivity to the infrared range.

It is preferable that the average particle diameter of the nanoparticle 9 be larger than or equal to 2 nm and smaller than or equal to 18 nm. If the particle diameter is reduced to the size of the Bohr radius or smaller of inherent excitons in the nanoparticle 9, this causes a phenomenon in which the bandgap of the nanoparticle 9 changes due to a quantum size effect. For example, it is said that such an average particle diameter is around 18 nm in PbS. That is, if the average particle diameter of the nanoparticles 9 is smaller than or equal to 18 nm, the bandgap can be controlled by a quantum size effect. If the average particle diameter of the nanoparticles 9 is larger than or equal to 2 nm, crystal growth of a quantum dot can be easily controlled in synthesis of the quantum dot.

Either the heavy metal atom 10 or the oxygen group atom 11 is located on the surface of the nanoparticle 9. When the particle diameter of the nanoparticle 9 increases, the ratio of the heavy metal atom 10 (the ratio X of the number of heavy metal atoms to the number of oxygen group atoms) in the surface of the nanoparticle 9 decreases. For example, in a case of a PbS nanoparticle, while the number of heavy metal atoms (lead atoms) 10 is two or more times the number of oxygen group atoms (sulfur atoms) 11 (X≥2) on the surface the nanoparticle whose particle diameter is smaller than 3 nm, the ratio of the heavy metal atoms 10 decreases as the particle diameter increases. Note that the ligands 12 couple to the heavy metal atoms 10 on the surface of the nanoparticle 9 in a quantum dot. That is, when the number of heavy metal atoms 10 is large on the surface of the nanoparticle 9, the number of ligands 12 surrounding the nanoparticle 9 is large, and the nanoparticles 9 are less likely to be condensed.

1.1.1.1 First Nanoparticle 9a

In the present embodiment, the photoelectric conversion layer 5 has a light absorption range in the visible range and, at the same time, also has a light absorption range in the infrared range. The light absorption range in the infrared range is defined mainly by the particle diameter of the first nanoparticle 9a. In a case of an infrared sensor using the first quantum dot 4a, the target value of the infrared range light absorption wavelength is often set to a range above 900 nm in which an infrared sensor using silicon has low sensitivity. In such a case, the particle diameter of the first nanoparticle 9a used as the photoelectric conversion layer 5 is necessarily large. For example, when PbS is used for the material of the first nanoparticle 9a, a particle diameter of 3.0 nm or larger is required in order to have the light absorption peak in a range above 900 nm. Further, at this time, the number of lead atoms is less than twice (X<2) the number of sulfur atoms in the ratio of the number of atoms on the surface of the nanoparticle 9.

1.1.1.2 Second Nanoparticle 9b

In the present embodiment, the second nanoparticle 9b mainly functions as a spacer that reduces condensation of the nanoparticles 9. Thus, it is desirable that many ligands 12 be coupled to the surface of the second nanoparticle 9b, and it is therefore desirable that the number of heavy metal atoms 10 be two or more times the number of oxygen group atoms 11 (X≥2) on the surface of the second nanoparticle 9b. Note that, in such a case, the particle diameter of the second nanoparticle 9b is necessarily small. For example, when PbS is used for the material of the second nanoparticle 9b, the particle diameter which allows the number of lead atoms on the surface of the second nanoparticle 9b to be two or more times the number of sulfur atoms is smaller than 3.0 nm.

1.1.2 Ratio of Quantum Dots

The first photoelectric conversion element of the present disclosure satisfies Equation (1) below, preferably satisfies Equation (2) below, and more preferably satisfies Equation (3) below. Further, the second photoelectric conversion element of the present disclosure satisfies Equation (2) below and preferably satisfies Equation (3) below.

$$0.3 < N \tag{1}$$

$$(2d_L/3d_S)^2 \leq N \tag{2}$$

$$N \leq (2d_L/d_S)^2 \tag{3}$$

N: ratio of the number of second quantum dots to the number of first quantum dots (the number of second quantum dots/the number of first quantum dots)

$d_L$: average particle diameter of the first nanoparticles 9a of the first quantum dots 4a $d_S$: average particle diameter of the second nanoparticles 9b of the second quantum dots 4b In the present embodiment, to prevent condensation of the nanoparticles 9, it is preferable to surround the first quantum dot 4a with the second quantum dots 4b, as illustrated in FIG. 3 and FIG. 4.

As illustrated in FIG. 3, the diameter of the second nanoparticle 9b of the second quantum dot 4b is denoted as $d_S$, and the molecular chain length of the first ligand 12a coordinated to the second nanoparticle 9b is denoted as $l_a$. Since it is preferable that the molecular chain length $l_a$ of the first ligand 12a be the same length as the diameter of the second nanoparticle 9b in order to ensure a dispersion property, the molecular chain length $l_a$ is set as $l_a = d_S$. Accordingly, a horizontal projected area A of the second quantum dot 4b is expressed as Equation (a) below.

$$A = \pi(3d_S/2)^2 \tag{a}$$

Further, the diameter of the first nanoparticle 9a of the first quantum dot 4a is denoted as $d_L$, and a surface area S of the first nanoparticle 9a of the first quantum dot 4a is then expressed as Equation (b) below.

$$S = 4\pi(d_L/2)^2 \tag{b}$$

To surround the first quantum dot 4a with the second quantum dots 4b, the sum of the horizontal projected areas A of the second quantum dots 4b is required to be the same as or larger than the sum of the surface area S of the first nanoparticle 9a forming the first quantum dot 4a. That is, the number of second quantum dots N with respect to the number of first quantum dots is preferably defined as Equation (2) below.

$$N \geq S/A = (2d_L/3d_S)^2 \tag{2}$$

Note that, although a higher ratio of the second quantum dots 4b improves the dispersion property of nanoparticles, the number of particles of the first quantum dots 4a relatively decreases, and the light absorption in a desired range may decrease. It is therefore desirable to define the upper limit value for N. As illustrated in FIG. 4, when the molecular chain length lb of the second ligand 12b is reduced to the limit to have lb=0, the horizontal projected area of the second quantum dot 4b is the minimum value $A_{min}$ expressed in Equation (c) below.

$$A_{min} = \pi(d_S/2)^2 \tag{c}$$

In a system in which the sum of the minimum horizontal projected areas $A_{min}$ of the second quantum dots 4b is above the sum of the surface area S of the first nanoparticle 9a forming the first quantum dot 4a, it is considered that the number of second quantum dots 4b is excessive. That is, it is more desirable that the ratio N of the number of second quantum dots to the number of first quantum dots be defined as Equation (3) below.

$$N \leq S/A_{min} = (2d_L/d_S)^2 \tag{3}$$

1.2 Formation of Photoelectric Conversion Layer 5

1.2.1 Synthesis of Quantum Dot

A manufacturing method disclosed in the specification of U.S. Pat. No. 7,118,627 can be used as a manufacturing method of PbS quantum dots that are one example of quantum dots. In manufacturing of PbS quantum dot, lead (II) oxide as a lead (Pb) precursor solution, oleic acid as organic ligands (first ligands), and octadecene as a solvent are put in a three-neck flask. The inside of the three-neck flask is replaced with nitrogen, the Pb precursor solution is heated at 90 degrees Celsius in an oil bath, and lead oxide and oleic acid are reacted with each other. Then, the reaction product is heated up to 120 degrees Celsius, and PbS quantum dots can be produced and grown. Further, an octadecene solution if bis-trimethylsilyl sulfide is separately prepared as a sulfur (S) precursor solution. The S precursor solution is rapidly poured in the Pb precursor solution heated at 120 degrees Celsius, and reaction can be caused under any temperature condition. Herein, the nanoparticle diameter of produced quantum dots depends on the temperature condition at reaction. Further, to reduce the nanoparticle diameter of the quantum dots, it is preferable to set the temperature at reaction to be low around room temperature, for example. After completion of reaction, the reaction product is cooled naturally to room temperature, methanol or acetone is added as a polar solvent, the mixture is centrifuged, and PbS particles are precipitated. After the supernatant thereof is removed, toluene is added, and washing is performed to re-disperse PbS particles. A quantum dot dispersion liquid in which quantum dots having any nanoparticle diameter are dispersed can be obtained by repeating such a centrifugal process and a re-dispersion process for multiple times to remove excessive oleic acid and an unreacted substance and finally adding a solvent of octane or the like.

1.2.1.1 First Ligand

The ligands 12 contained in the quantum dot dispersion liquid work as ligands coordinated to the nanoparticle 9 and, because of having molecular structure that is likely to be a stereotypical obstacle, also serve as a dispersion agent that disperses the nanoparticles 9 in a solvent. It is desirable that the first ligand 12a be a ligand having at least six or more carbons in a main chain in terms of improvement of dispersion of the nanoparticle 9. In particular, when caused to function as a spacer to reduce condensation of nanoparticles, it is more desirable for the first ligand 12a to have a molecular chain length that is the same as or larger than the diameter of the second nanoparticle 9b to coordinate.

Herein, when there is branched structure in a molecule, the molecular chain length is determined by the length of the main chain. It is basically difficult for a ligand having a short molecular chain length to be dispersed into an organic solvent system. Dispersion as used herein refers to a state with no precipitation or suspension of particles.

Specifically, the first ligand 12a may be a saturated compound or may be an unsaturated compound and may be decanoic acid, lauric acid, myristic acid, palmitic acid, stearic acid, behenic acid, oleic acid, erucic acid, oleylamine, dodecylamine, dodecane thiol, 1,2-hexadecan thiol, trioctyl phosphine oxide, cetrimonium bromide, or the like. It is preferable that the first ligand 12a be a compound that is less likely to remain in a film during formation of the photoelectric conversion layer 5 and that the first ligand 12a be at least one of oleic acid and oleylamine among the above in terms of difficulty in remaining in the photoelectric conversion layer 5 while ensuring dispersion stability in quantum dots.

1.2.2 Preparation of Quantum Dot Dispersion Liquid for Generating Photoelectric Conversion Layer In the present embodiment, the quantum dot dispersion liquid used for generating a photoelectric conversion layer contains the first quantum dots 4a and also contains the second quantum dots 4b at a certain ratio or higher. In the first photoelectric conversion element, the ratio N in the quantum dot dispersion liquid preferably satisfies Equation (1) above, more preferably satisfies Equation (2) above, and much more preferably satisfies Equation (3) above. Further, in the second photoelectric conversion element, the ratio N preferably satisfies Equation (2) above and more preferably satisfies Equation (3) above.

The solvent contained in the quantum dot dispersion liquid is not particularly limited and is preferably a solvent that less dissolves quantum dots and more dissolves the first ligands 12a. The solvent is preferably an organic solvent and may be, specifically, alkane [n-hexane, n-octane, or the like], benzene, toluene, or the like.

1.2.3 Addition of Quantum Dot Dispersion Liquid

A photoelectric conversion layer can be obtained by adding quantum dots onto electrodes, a substrate, or the like. A manufacturing method of a photoelectric conversion layer including a mass of nanoparticles as quantum dots is not particularly limited. When dispersed in a solvent in a state of being modified by ligands (first ligands) having a long molecular chain length such as oleic acid, quantum dots are less likely to be in a condensed bulk state. A scheme to add a quantum dot dispersion liquid onto a substrate is not particularly limited and may be a method of applying a quantum dot dispersion liquid onto a substrate, a method of immersing a substrate in a quantum dot dispersion liquid, or the like. More specifically, as a method of applying a quantum dot dispersion liquid onto a substrate, a liquid-phase method such as a spin coating method, a CAT method, a dip coating method, a blade coating method, a spray coating method, an inkjet method, a dispenser method, a screen printing method, a letterpress printing method, an intaglio printing method, or the like can be used. In particular, it is possible to pattern an application film at any position on a substrate by using an inkjet method, a dispenser method, a screen printing method, a letterpress printing method, and an intaglio printing method.

1.2.4 Ligand Exchange

After the quantum dot dispersion liquid is added onto a substrate, a solution of the second ligands having a relatively shorter molecular chain length than the first ligands is further added thereon, thereby ligands are exchanged, and a photoelectric conversion layer can be formed.

Herein, in particular, when the particle diameter of a nanoparticle of a quantum dot is large and coordinated ligands are few, fusion of nanoparticles (called necking) is likely to occur in a process of ligand exchange and a heating process described later. Fusion of nanoparticles causes a reduction in the bandgap and a significant increase in dark current. Moreover, the light absorption range is shifted to a lower energy side. In the present embodiment, however, quantum dots include the second quantum dots coordinated with many ligands. The second quantum dots serve as spacers even under the environment of a process of ligand exchange and a heating process and prevent fusion of nanoparticles.

1.2.4.1 Second Ligand

A film formed of the quantum dots 4 to which the first ligands 12a are coordinated has a large spacing between adjacent nanoparticles 9, has poor conductivity of photocarriers occurring due to light irradiation, and has an extremely low photoelectric conversion function. Accordingly, ligand exchange to the second ligands 12b having a relatively shorter molecular chain length is performed.

In the present embodiment, the second ligand 12b is a ligand made of an organic compound. The organic ligand may be formed of an organic compound whose boiling point is 200 degrees Celsius or higher. The second ligand 12b is at least one type of ligand selected from ligands of organic compounds or the like including ethane dithiol, benzene dithiol, dibenzene dithiol, mercaptobenzoic acid, dicarboxybenzene, benzene diamine, and dibenzene diamine. More specifically, selection may be made from 1,3-benzene dithiol, 1,4-benzene dithiol, 3-mercaptobenzoic acid, and 4-mercaptobenzoic acid. In particular, a ligand such as benzene thiol including a benzene ring is preferable because the boiling point thereof exceeds 200 degrees Celsius. Since evaporation of ligands is reduced even at a high temperature above 140 degrees Celsius, heat resistance as a quantum dot film is high. The ligand solvent contained in the second ligand solution is not particularly limited, an organic solvent having a high dielectric constant is preferable, and ethanol, acetone, methanol, acetonitrile, dimethyl formamide, dimethyl sulfoxide, butanol, propanol, or the like are particularly preferable.

1.2.5 Post-Processing

By repeating addition of a quantum dot dispersion liquid and ligand exchange, it is possible to reduce occurrence of cracking or crack of the photoelectric conversion layer having a mass of quantum dots, increase the electric conductivity, and increase the thickness of the photoelectric conversion layer. The post-processing may have a washing process in order to remove excessive ligands, ligands detached from quantum dots, a residual solvent, other impurities, or the like. Specifically, the substrate on which the quantum dot mass or the photoelectric conversion layer are formed is applied with or dipped in at least one of a quantum dot dispersion liquid solvent and a ligand solvent.

Formation of the photoelectric conversion layer may have a dispersion liquid drying process to dry the quantum dot dispersion liquid, a solution drying process to dry the ligand solution, or the like. In the drying, after a quantum dot mass is formed as a photoelectric conversion layer, the solvent remaining in the quantum dot mass is heated to a temperature for drying. Further, after the ligand exchange process, a ligand solution is heated to a solution drying temperature for drying. Alternatively, the photoelectric conversion layer may be left at room temperature.

An electronic device such as a photoelectric conversion element, a light emitting diode, a photodetection element, a light receiving element array, an imaging sensor, an image sensor, an image pickup device, or the like is provided for practical use by being solder-mounted on a printed board or the like. In the solder mounting process, a heating process around 200 degrees Celsius is used. Further, an electronic device such as an imaging sensor, an image sensor, an image pickup device, or the like is accommodated in a package made of a resin or a ceramic and glass-sealed for water resistance or dust resistance. In a package mounting process, the electronic device is fixed by an adhesive agent and then electrically connected to a package extraction wiring by wire bonding or the like with a gold thin wire. A heating process at least 145 degrees Celsius or higher is used for adhesive agent curing and wire bonding.

Furthermore, when the electronic device is used in a visible light range as an imaging sensor, an image sensor, or an image pickup device, a color filter that can disperse light into RGB and micro-lenses for collecting light are used. The color filter and the micro-lenses are often formed of a resin, and a heating process at least 150 degrees Celsius or higher is used for curing the resin. The photoelectric conversion layer to be used in an imaging sensor, an image sensor, or an image pickup device is required to be configured so that nanoparticles are not fused even at the temperature of the heating process of the mounting process, the color filter process, and the micro-lens process described above.

In the present embodiment, the photoelectric conversion layer includes the second quantum dots. The second quantum dots serve as spacers even at the temperature of the heating process and prevent fusion of nanoparticles.

Therefore, the photoelectric conversion layer according to the present embodiment has low dark current and, in addition, a high SN ratio (a value obtained by dividing an output value from a sensor by a dark current value) and can be used in various photoelectric conversion devices.

2. Interface Layers 3, 6

The first interface layer 3 and the second interface layer 6 may be provided between the photoelectric conversion layer 5 and the electrodes (the first electrode layer 2, the second electrode layer 7) in order to improve electric characteristics. A layer that blocks electrons and transfers only holes (electron block layer) may be formed on an electrode that collects holes (positive electrode), and a layer that blocks holes and transfers only electrons (hole block layer) may be formed on an electrode that collects electrons (negative electrode).

As a material of the electron block layer, a material that can efficiently transfer holes generated by the photoelectric conversion layer 5 to the positive electrode is preferable. To this end, it is preferable that the material of the electron block layer have a nature such as high hole mobility, high conductivity, small hole injection barrier against the positive electrode, small hole injection barrier against the photoelectric conversion layer 5, or the like. Moreover, when light is taken into the photoelectric conversion layer 5 through the electron block layer, it is preferable to use a material having high transparency as the material of the electron block layer. Typically, since visible light of the light is taken into the photoelectric conversion layer 5, it is preferable to use a material whose transmittance of transmitting visible light is typically 60% or higher, in particular, 80% or higher as the material of the transparent electron block layer. In terms of the above, a preferable example of the material of the electron block layer may be a p-type semiconductor material of an inorganic semiconductor or the like such as molybdenum oxide $MoO_3$, nickel oxide $NiO$, or the like.

On the other hand, the function required for the hole block layer is to block holes separated from the photoelectric conversion layer 5 and transfer electrons to the negative electrode. It is therefore preferable that the material of the hole block layer have a nature resulted when the positive electrode is replaced with the negative electrode and the hole is replaced with the electron in the above description for the electron block layer. Further, a configuration of emitting light from the negative electrode side or an effective use of light reflected from the negative electrode side may be considered, and in such a case, high transmittance is also required. In terms of the above, a preferable example of the material of the hole block layer may be an n-type semiconductor material selected from an inorganic semiconductor such as titanium oxide $TiO_2$ or an organic semiconductor such as fullerene or a fullerene derivative.

3. Electrodes 2, 7

The electrodes 2 and 7 may be a pair of electrodes such as the upper electrode layer and the lower electrode layer, the first electrode layer and the second electrode layer, or the like. The electrodes 2 and 7 can be formed of any conductive material. An example of the material forming the electrode may be a metal such as platinum, gold, silver, aluminum, chromium, nickel, copper, titanium, magnesium, calcium, barium, sodium, or the like or an alloy thereof; a metal oxide such as indium oxide, tin oxide, or the like or a composite oxide thereof (for example, ITO, IZO); a conductive polymer such as polyacetylene; a conductive composite material in which conductive particles such as metal particles, carbon black, fullerene, carbon nanotubes, or the like are dispersed in a matrix of a polymer binder or the like; or the like. Note that, as the material forming the electrodes 2 and 7, one type of material may be used alone, or two or more types of materials may be used in combination at any combination and ratio.

The electrodes 2 and 7 have functions of collecting electrons and holes generated inside the photoelectric conversion layer 5. It is therefore preferable to use the forming material suitable to collect electrons and holes as the material forming the electrodes 2 and 7 among the materials described above. The material of the electrode suitable to collect holes may be, for example, a material having a high work function, such as Au, ITO, or the like. On the other hand, the material of the electrode suitable to collect electrons may be, for example, a material having a low work function, such as Al. The thickness of the electrodes 2 and 7 is not particularly limited, is determined as appropriate taking the electrode material, conductivity, transparency, or the like into consideration, and may be larger than or equal to 10 nm and smaller than or equal to 100 μm.

4. Substrate 1

The shape, structure, size, or the like of the substrate 1 are not particularly limited and are selected as appropriate in accordance with the purpose. The structure of the substrate 1 may be single-layer structure or may be multilayer structure. As the substrate 1, a substrate made of an inorganic material such as glass, silicon, stainless, or the like, a resin, a resin composite material, or the like can be used, for example. In a case of a silicon substrate, an integrated circuit may be formed. Further, the first electrode layer 2, an insulating film, or the like may be provided on the substrate 1, and in such a case, a quantum dot dispersion liquid is added onto the first electrode layer 2 or the insulating film on the substrate 1. When a wiring layer is formed on the substrate of silicon or the like, the substrate 1 including such a wiring layer is referred to as a substrate. When there is an interlayer insulating layer in contact with the first electrode layer 2, the substrate including such an interlayer insulating layer is referred to as a substrate.

5. Example of Use of Photoelectric Conversion Element

The photoelectric conversion element according to the present embodiment may be used in the photoelectric conversion device. The photoelectric conversion device has an optical system having a plurality of lenses and a light receiving element that receives light that has transmitted through the optical system, and the light receiving element is a light receiving element having a photoelectric conversion element. Specifically, the photoelectric conversion device may be a digital still camera or a digital video camera.

The photoelectric conversion element according to the present embodiment may convert near-infrared light of a wavelength range of 700 nm to 2500 nm into charges, may convert visible light of a wavelength range of 360 nm to 830 nm into charges, or may have both the functions thereof. In the photoelectric conversion element of the present embodiment in particular, the second quantum dots 4b of the quantum dots forming the photoelectric conversion layer 5 not only serve to prevent fusion of the nanoparticles 9 but also have a function of absorbing and converting visible light into charges. That is, in the photoelectric conversion layer 5 of the present embodiment, even with a high ratio of the second quantum dots 4b, the photoelectric conversion efficiency does not substantially decrease in the visible light range and only dark current decreases. From this, it is more preferable that the photoelectric conversion element according to the present embodiment be used in a light receiving element and a photoelectric conversion device that converts visible light and near-infrared light into charges.

EXAMPLES

While the present disclosure will be more specifically described below with examples, the present disclosure is not limited to the following examples unless exceeding the spirit thereof.

Example 1

Production of First Quantum Dot Dispersion Liquid and Second Quantum Dot Dispersion Liquid The first quantum dot dispersion liquid was produced by using the method of the specification of U.S. Pat. No. 7,118,627. Specifically, 892 mg of lead (II) oxide as lead (Pb) precursor solution, 28 mL of oleic acid as an organic ligand (first ligand), and octadecene as a solvent were put in a three-neck flask. The inside of the three-neck flask was replaced with nitrogen, the Pb precursor solution was heated at 90 degrees Celsius in an oil bath, and lead oxide and oleic acid were reacted with each other. In addition, 1.9 mM of an octadecene solution of bis-trimethylsilyl sulfide was separately prepared as a sulfur (S) precursor solution. Then, 20 mL of the S precursor solution was rapidly poured in the Pb precursor solution, and reaction was performed at 150 degrees Celsius to obtain the first quantum dots. The first quantum dots were then purified and re-dispersed in an octane solvent so that a solute concentration was 80 mg/ml, and the first quantum dot dispersion liquid was produced.

The second quantum dot dispersion liquid was produced in the same manner as the first quantum dot dispersion liquid except for change of the addition of oleic acid and the reaction temperature as indicated in Table 1.

Measurement of Nanoparticle Size

Figure 5A:
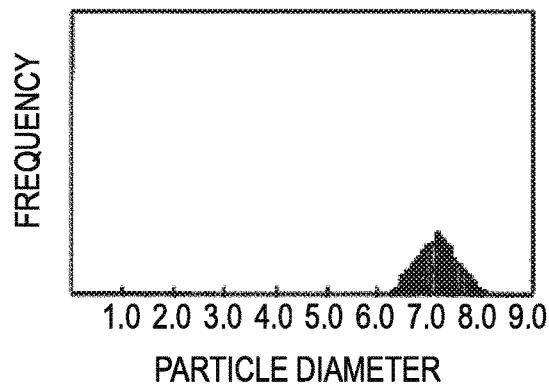
FIG. 5A is a diagram illustrating a nanoparticle granularity distribution of a quantum dot dispersion liquid used in Example 1.
Figure 5B:
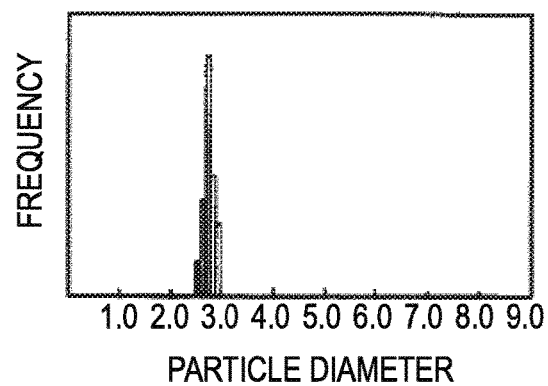
FIG. 5B is a diagram illustrating a nanoparticle granularity distribution of a quantum dot dispersion liquid used in Example 1.

For each quantum dot dispersion liquid, the nanoparticle size in each of the dispersion liquids was measured by TEM observation. Specifically, a TEM image was binarized to extract the area of each particle, and a diameter corresponding to a circle was calculated from the area. Note that Thermo Fisher Scientific, Tecnai F20 was used for the TEM observation. FIG. 5A illustrates the nanoparticle granularity distribution in the first quantum dot dispersion liquid according to the present example, and FIG. 5B illustrates the nanoparticle granularity distribution in the second quantum dot dispersion liquid. As a result, it was found that nanoparticles in the first quantum dot dispersion liquid are distributed in a range of 6.3 nm to 8.1 nm with the average of 7.2 nm of the diameter corresponding to a circle ($d_L$=7.2 nm). Further, it was found that nanoparticles in the second quantum dot dispersion liquid are distributed in a range of 2.5 nm to 2.9 nm with the average of 2.7 nm of the diameter corresponding to a circle ($d_S$=2.7 nm). Note that the average of particle diameters was calculated as a mathematical average diameter based on the quantity from the granularity distribution. The result is indicated in Table 1.

Evaluation of Nanoparticle Surface

The particle surface of nanoparticles in each dispersion liquid was also evaluated. First, each quantum dot dispersion liquid was spin-coated on a $TiO_2$ film deposited on a Si substrate to form a quantum dot film. The binding energy of the outermost surface of each quantum dot film was then measured by using XPS. Note that UNVAC-PHI INCORPORATED, Quantera, SXM was used for the XPS. From the peak integration intensities for $Pb_{4f}$ and $S_{2S}$ of the obtained XPS spectrum, the ratio of lead atoms:sulfur atoms on the nanoparticle surface forming the first quantum dot film was estimated to be 1.0:1.0 (X=1.0). Similarly, the ratio of lead atoms:sulfur atoms on the nanoparticle surface forming the second quantum dot film was estimated to be 2.1:1.0 (X=2.1). The result is indicated in Table 1.

TABLE 1

|  | Oleic acid addition [ml] | Reaction temperature [° C.] | Average particle diameter [nm] | X |
|---|---|---|---|---|
| First quantum dot | 28 | 150 | 7.2 | 1.0 |
| Second quantum dot | 4.2 | 45 | 2.7 | 2.1 |

Preparation of Quantum Dot Dispersion Liquid for Generating Photoelectric Conversion Layer The first quantum dot dispersion liquid and the second quantum dot dispersion liquid were mixed at an arbitrary ratio. Specifically, five types of quantum dot dispersion liquids A to E were prepared in which the second quantum dot dispersion liquid was mixed to the first quantum dot dispersion liquid at mass ratios of 0.1, 0.2, 0.5, 1.0, and 1.6, respectively. Note that, when the mass ratio is converted into the particle quantity ratio by using the granularity distribution result obtained in the TEM observation described above, it can also be said that these quantum dot dispersion liquids are quantum dot dispersion liquids of the ratios N=1.9, 3.8, 9.5, 19.0, and 30.3 that are ratios of the number of second quantum dots to the number of first quantum dots.

Production of Photoelectric Conversion Element

The photoelectric conversion element illustrated in FIG. 1 was produced as follows. The substrate 1 in which the surface on the first electrode layer 2 side is insulated by a silicon oxide film was prepared, and a TiN film as the first electrode layer 2 and a titanium oxide (TiO$_2$) film as the first interface layer 3 were formed by a sputtering method, respectively.

The quantum dot dispersion liquids A to E were applied onto the first interface layer 3 by a spin coating method, respectively, and a ligand solution including organic ligands (second ligands) of benzene dithiol (1,4-BDT) was then similarly applied to form the photoelectric conversion layer 5. The produced photoelectric conversion layer 5 was left overnight and dried inside a globe box under a nitrogen atmosphere (oxygen concentration of 1 ppm or less, moisture concentration of 1 ppm or less).

Molybdenum oxide (MoO$_3$) was formed as the second interface layer 6 on the photoelectric conversion layer 5 by a vacuum deposition method. Indium oxide (ITO) containing tin that is a transparent conductive film was formed as the second electrode layer 7 on the second interface layer 6 by a sputtering method. The resultant was then heated at 170 degrees Celsius for 5 minutes under an environment of the oxygen concentration of 0.1 ppm to 1% inside the globe box to obtain the photoelectric conversion elements A to E.

Further, as a comparative element, a photoelectric conversion element was produced in the same manner except that only the first quantum dot dispersion liquid was used.

Evaluation of Photoelectric Conversion Element

Next, for the photoelectric conversion elements A to E and the comparative element, the electric conductivity of the photoelectric conversion elements was compared and evaluated by using a semiconductor parameter analyzer. First, an application voltage to the electrodes were swept between −5V to 5V with the photoelectric conversion element being not irradiated with light to acquire the I-V characteristic in a dark state. A current value in a state where a bias of +2V was applied was employed as a dark current value $I_d$.

An optical current value in a state where the photoelectric conversion element was irradiated with monochrome light (irradiation intensity of 5 μW/cm$^2$) was evaluated. Measurement was made while the wavelength of the monochrome light was changed from 300 nm to 2000 nm by a step of 5 nm. The increment in current from the dark current $I_d$ when irradiated with light of a wavelength of 500 nm was denoted as visible range optical current $I_V$, and the increment in current from the dark current $I_d$ when irradiated with light of a wavelength of 1700 nm was denoted as infrared range optical current $I_{IR}$. Further, the SN ratio was calculated from $(I_{IR}/I_d)^2$.

Table 2 indicates results of the dark current $I_d$, the optical current $I_V$, the optical current $I_{IR}$, and the SN ratio of each photoelectric conversion element in the present example. Note that each value is normalized with a result obtained by the comparative element.

TABLE 2

| | Mixture ratio of second quantum dot dispersion liquid (mass ratio) | N | Dark current $I_d$ | 500 nm optical current $I_r$ | 1700 nm optical current $I_{IR}$ | 1700 nm SN ratio |
|---|---|---|---|---|---|---|
| Element A | 0.1 | 1.9 | 0.98 | 1.00 | 0.83 | 0.72 |
| Element B | 0.2 | 3.8 | 0.68 | 1.00 | 0.73 | 1.15 |
| Element C | 0.5 | 9.5 | 0.25 | 0.99 | 0.63 | 6.35 |
| Element D | 1.0 | 19.0 | 0.12 | 0.99 | 0.40 | 11.11 |
| Element E | 1.6 | 30.3 | 0.10 | 0.98 | 0.25 | 6.25 |

As indicated in Table 2, in all the elements A to E, the dark current $I_d$ was reduced compared to the comparative element.

Further, since $d_L$=7.2 nm and $d_S$=2.7 nm in the present example, it is preferable that N is greater than or equal to 3.2 in accordance with Equation (2). As indicated in Table 2, since the optical current $I_{IR}$ when irradiated with light of a wavelength of 1700 nm is reduced but the dark current $I_d$ is reduced at a rate over the reduction of the optical current $I_{IR}$ in the elements B to E, the SN ratio is increased, which matches the result calculated by Equation (2).

Example 2

Production of First Quantum Dot Dispersion Liquid and Second Quantum Dot Dispersion Liquid The first quantum dot dispersion liquid and the second quantum dot dispersion liquid were produced in the same manner as in Example 1 except for change of the addition of oleic acid and the reaction temperature as indicated in Table 3.

Measurement of Nanoparticle Size

Figure 6A:
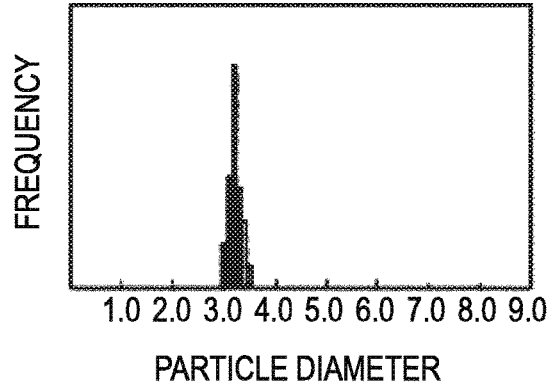
FIG. 6A is a diagram illustrating a nanoparticle granularity distribution of a quantum dot dispersion liquid used in Example 2.
Figure 6B:
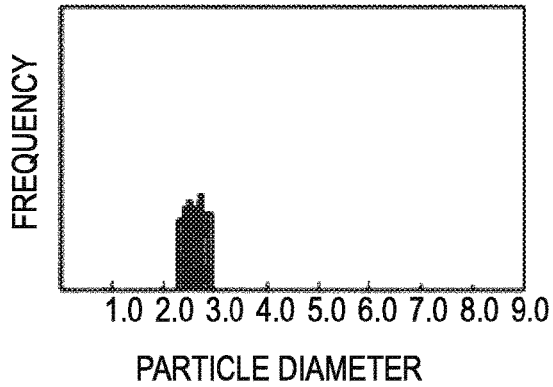
FIG. 6B is a diagram illustrating a nanoparticle granularity distribution of a quantum dot dispersion liquid used in Example 2.

For each quantum dot dispersion liquid in the present example, the granularity distribution of nanoparticles was evaluated in the same manner as in Example 1. FIG. 6A illustrates the nanoparticle granularity distribution in the first quantum dot dispersion liquid according to the present example, and FIG. 6B illustrates the nanoparticle granularity distribution in the second quantum dot dispersion liquid. It was found from these results that nanoparticles in the first quantum dot dispersion liquid are distributed in a range of 3.0 nm to 3.5 nm with the average of 3.2 nm of the diameter corresponding to a circle ($d_L$=3.2 nm). Further, it was found that nanoparticles in the second quantum dot dispersion liquid are distributed in a range of 2.3 nm to 2.9 nm with the average of 2.6 nm of the diameter corresponding to a circle ($d_S$=2.6 nm). The result is indicated in Table 3.

Evaluation of Nanoparticle Surface

The particle surface of nanoparticles in each dispersion liquid in the present example was also evaluated in the same method as in Example 1. As a result, the ratio of lead atoms:sulfur atoms on the nanoparticle surface forming the first quantum dot film in the present example was estimated to be 1.8:1.0 (X=1.8). Further, the ratio of lead atoms:sulfur atoms on the nanoparticle surface forming the second quantum dot film was estimated to be 2.2:1.0 (X=2.2). The result is indicated in Table 3.

TABLE 3

| | Oleic acid addition [ml] | Reaction temperature [° C.] | Average particle diameter [nm] | X |
|---|---|---|---|---|
| First quantum dot | 4.2 | 80 | 3.2 | 1.8 |

TABLE 3-continued

|  | Oleic acid addition [ml] | Reaction temperature [° C.] | Average particle diameter [nm] | X |
|---|---|---|---|---|
| Second quantum dot | 4.2 | 40 | 2.6 | 2.2 |

Preparation of Quantum Dot Dispersion Liquid for Generating Photoelectric Conversion Layer Also in the present example, the first quantum dot dispersion liquid and the second quantum dot dispersion liquid were mixed at an arbitrary ratio in the same manner as in Example 1. Specifically, five types of quantum dot dispersion liquids F to J were prepared in which the second quantum dot dispersion liquid was mixed to the first quantum dot dispersion liquid at mass ratios of 0.2, 0.4, 0.8, 1.8, and 4.0, respectively. Note that, when the mass ratio is converted into the particle quantity ratio by using the granularity distribution result described above, it can also be said that these quantum dot dispersion liquids are quantum dot dispersion liquids of the ratios N=0.34, 0.68, 1.36, 3.05, and 6.78 that are ratios of the number of second quantum dots to the number of first quantum dots.

Production of Photoelectric Conversion Element

The prepared quantum dot dispersion liquid for generating a photoelectric conversion layer was used to produce a photoelectric conversion element in the same manner as in Example 1. Further, as a comparative element, a photoelectric conversion element was produced in the same manner except that only the first quantum dot dispersion liquid was used.

Evaluation of Photoelectric Conversion Element

Next, for photoelectric conversion elements F to J and the comparative element, the dark current $I_d$, the visible range optical current $I_V$, and the infrared range optical current $I_{IR}$ were measured, and the SN ratio was calculated in the same manner as in Example 1. Note that, in the present example, the infrared range optical current $I_{IR}$ was defined as the increment in current from the dark current $I_d$ when irradiated with light of a wavelength of 940 nm. Table 4 indicates the result. Note that each value is normalized with a result obtained by the comparative element.

TABLE 4

|  | Mixture ratio of second quantum dot dispersion liquid (mass ratio) | N | Dark current $I_d$ | 500 nm optical current $I_r$ | 940 nm optical current $I_{IR}$ | 940 nm SN ratio |
|---|---|---|---|---|---|---|
| Element F | 0.2 | 0.34 | 0.98 | 1.00 | 0.87 | 0.79 |
| Element G | 0.4 | 0.68 | 0.70 | 1.00 | 0.75 | 1.15 |
| Element H | 0.8 | 1.36 | 0.35 | 1.00 | 0.61 | 3.04 |
| Element I | 1.8 | 3.05 | 0.26 | 0.99 | 0.33 | 1.61 |
| Element J | 4.0 | 6.78 | 0.26 | 0.97 | 0.25 | 0.92 |

As indicated in Table 4, in all the elements F to J, the dark current $I_d$ was reduced compared to the comparative element.

Further, since $d_L$=3.2 nm and $d_S$=2.6 nm in the present example, it is preferable that N be greater than or equal to 0.63 and less than or equal to 6.06 in accordance with Equation (2) and Equation (3). As indicated in Table 4, since the optical current $I_{IR}$ when irradiated with light of a wavelength of 940 nm is reduced but the dark current $I_d$ is reduced at a rate over the reduction of the optical current $I_{IR}$ in the elements G to I, the SN ratio is increased, which matches the result calculated by Equation (2) and Equation (3).

According to the present disclosure, since the second quantum dots serve as spacers to the first quantum dots, condensation of nanoparticles during a ligand exchange operation can be reduced, and dark current can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-187555, filed Oct. 11, 2019, which is hereby incorporated by reference herein in its entirety.

What is claimed is:

1. A photoelectric conversion element comprising:
  a photoelectric conversion layer including first quantum dots and second quantum dots,
  wherein a first quantum dot of the first quantum dots and a second quantum dot of the second quantum dots each have a nanoparticle including a heavy metal atom and an oxygen group atom,
  wherein a ratio X of a number of heavy metal atoms to a number of oxygen group atoms is less than 2 on a surface of the nanoparticle of the first quantum dot,
  wherein the ratio X is greater than or equal to 2 on a surface of the nanoparticle of the second quantum dot,
  wherein the first quantum dots have a peak position different from a peak position of the second quantum dots in a particle diameter distribution, and
  wherein equation (1) is satisfied:

$$0.3 < N \qquad (1),$$

where N denotes a ratio of a number of the second quantum dots to a number of the first quantum dots.

2. The photoelectric conversion element according to claim 1, wherein equation (2) is satisfied:

$$(2d_L/3d_S)^2 \le N \qquad (2),$$

where $d_L$ denotes an average particle diameter of nanoparticles of the first quantum dots, and $d_S$ denotes an average particle diameter of nanoparticles of the second quantum dots.

3. The photoelectric conversion element according to claim 1, wherein equation (3) is satisfied:

$$N \le (2d_L/d_S)^2 \qquad (3),$$

where $d_L$ denotes an average particle diameter of nanoparticles of the first quantum dots, and $d_S$ denotes an average particle diameter of nanoparticles of the second quantum dots.

4. A photoelectric conversion element comprising:
  a photoelectric conversion layer including first quantum dots and second quantum dots,
  wherein a first quantum dot of the first quantum dots and a second quantum dot of the second quantum dots each have a nanoparticle including a heavy metal atom and an oxygen group atom,
  wherein a ratio X of a number of heavy metal atoms to a number of oxygen group atoms is less than 2 on a surface of the nanoparticle of the first quantum dot,
  wherein the ratio X is greater than or equal to 2 on a surface of the nanoparticle of the second quantum dot, wherein the first quantum dots have a peak position different from a peak position of the second quantum dots in a particle diameter distribution, and wherein equation (2) is satisfied:

$$(2d_L/3d_S)^2 \leq N \quad (2),$$

where $d_L$ denotes an average particle diameter of nanoparticles of the first quantum dots, $d_S$ denotes an average particle diameter of nanoparticles of the second quantum dots, and N denotes a ratio of a number of the second quantum dots to a number of the first quantum dots.

5. The photoelectric conversion element according to claim 4, wherein equation (3) is satisfied:

$$N \leq (2d_L/d_S)^2 \quad (3).$$

6. The photoelectric conversion element according to claim 1, wherein the heavy metal atom is Pb or Cd.

7. The photoelectric conversion element according to claim 1, wherein the oxygen group atom is O, S, Se, or Te.

8. The photoelectric conversion element according to claim 1, wherein the heavy metal atom is Pb, and the oxygen group atom is S.

9. The photoelectric conversion element according to claim 1, wherein a particle diameter of a nanoparticle of the first quantum dot is larger than or equal to 3.0 nm, and a particle diameter of a nanoparticle of the second quantum dot is smaller than 3.0 nm.

10. The photoelectric conversion element according to claim 1, wherein the photoelectric conversion element is a photodetection element.

11. A photoelectric conversion device comprising: an optical system having a plurality of lenses; and a light receiving element that receives light that transmitted through the optical system, wherein the light receiving element has the photoelectric conversion element according to claim 1.

12. The photoelectric conversion element according to claim 1, wherein the peak position of the first quantum dots is greater than the peak position of the second quantum dots.

* * * * *